Feb. 14, 1956 L. D. ARMSTRONG 2,735,050
LIQUID SOLDERING PROCESS AND ARTICLES MADE THEREBY
Filed Oct. 23, 1952
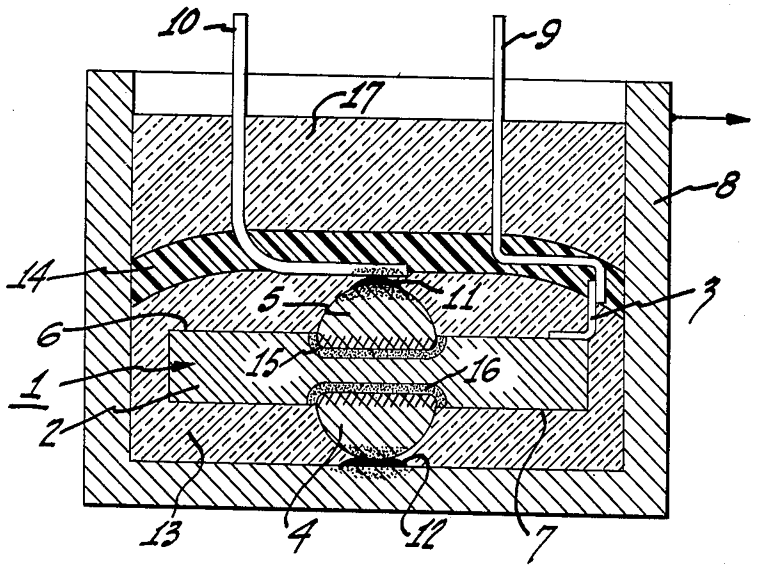
INVENTOR.
LORNE D. ARMSTRONG
BY J. C. Whittaker
ATTORNEY United States Patent Office 2,735,050
Patented Feb. 14, 1956

2,735,050

LIQUID SOLDERING PROCESS AND ARTICLES MADE THEREBY

Lorne D. Armstrong, Princeton, N. J., assignor to Radio Corporation of America, a corporation of Delaware Application October 23, 1952, Serial No. 316,517
The terminal 15 years of the term of the patent to be granted has been disclaimed.
4 Claims. (Cl. 317—235)

This invention relates to an improved method of and means for making electrical and thermal contact between two mercury-soluble metallic surfaces, and more particularly to an improved method suitable for mounting semiconductor devices such as transistors. This invention also relates to improved articles made by the process.

Often, and especially in the production of so-called junction type transistors, it is desirable to effect electrical and thermal contact between two metallic surfaces without the application of heat other than ordinary room temperature or any considerable pressure. It is also desirable in assembling certain devices, to provide a degree of slippage between two surfaces, thus to allow for adjustment of the relative positions of two bodies without disturbing the electrical and thermal contact between their surfaces.

It has now been discovered that excellent electrical and thermal contact can be made between two metallic surfaces, each soluble in the same mercury-metallic solution, at room temperature by wetting each surface with a fluid mercury solution of a metal and placing the two wetted surfaces in physical contact with each other. This method of soldering is especially advantageous in the production of transistors and in other applications where it is desirable to avoid the use of heat in excess of ambient temperature.

It should be noted that the invention is applicable to the formation of electrical and thermal contact between any metallic surfaces composed of metals soluble in mercury. In this application the phrases "soluble in mercury" or "mercury-soluble" mean that a mercury-metallic solution will either appreciably dissolve or at least wet the surface of a substance so described to the extent that the mercury-metallic solution cannot be separated from the surface by physical means. In this connection it is pointed out that polishing or cutting away removes not only the solution but the surface also, and does not constitute a separation of the mercury-metallic solution from the surface.

An object of the invention is to provide an improved method of making electrical and thermal contact between two metallic surfaces, preferably at room temperature.

Another object of the invention is to provide an improved method for effecting electrical and thermal contact between two metallic bodies, at least one of which is adversely sensitive to heat, and both of which have mercury-soluble surfaces.

Another object of the invention is to provide an improved method of making electrical and thermal contact between the elements of a semi-conductor device and other metallic bodies.

Another object of the invention is to provide an improved method of assembling junction type semi-conductor devices.

A still further object of the invention is to provide an improved semi-conductor device having its parts assembled in accordance with the improved method of the present invention.

These and other objects will be more readily apparent and the invention more easily understood by reference to the following detailed description and the drawing of which the single figure is a sketch of an enlarged cross-sectional elevational view of a semi-conductor device mounted in accordance with the invention.

An important feature of the invention comprises the joining of two metallic surfaces by using a liquid or fluid solder comprising a solution of a metal in mercury. In the practice of the invention, at least one of the two metallic surfaces to be joined, preferably both of them, is wetted with a fluid solution of a metal in mercury and the surfaces then placed in physical contact with each other. The mercury solution provides excellent electrical and thermal contact between the two metallic surfaces and minimizes the effect of oxidation films or irregularities in the surfaces.

In the production of a junction type transistor, it is necessary to make electrical contact between the various elements of the transistor and lead wires so that electrical voltages may be applied to, and electrical currents conducted through the transistor. Also, in the production of a transistor designed to carry relatively large amounts of electric current, it is desirable to attach a cooling fin to an element of the transistor and to establish both electrical and thermal contact between the cooling fin and the transistor element.

A junction type transistor includes p-n rectifying junction areas between zones of different type conductivity. Usually the areas of junction are sensitive to heat, being effectively destroyed by the application of excessive heat. Sometimes heat of as little as 80° C. will accomplish effective destruction of an unprotected junction area.

For this reason it is usually desirable not only to operate a junction type transistor below a controlled temperature limit, but also to assemble it without applying heat above room temperature. Copper cooling fins are often used to carry off excess heat generated by the operation of a transistor, but previous methods for making the necessary electrical and thermal contacts between the elements of a transistor and electrical lead wires and cooling fins have involved application of heat directly to the work, as described, for example, in the co-pending application of Charles W. Mueller, Serial No. 316,171, filed October 22, 1952. Soldering and spot welding have been used, and great care has been necessary in effecting the contact. Also, transistors are frequently damaged by the heat of spot welding and of soldering by ordinary methods.

In a preferred embodiment of the invention as illustrated in the drawing, a transistor 1, consisting of a wafer of germanium 2 which may be approximately ¼ inch long, ¼ inch wide and 0.01 inch thick, has a metal base tab 3 at one end and indium-germanium alloy dots 4 and 5 which may be approximately 0.1 inch in diameter, on two opposite sides 6 and 7, forming p-n rectifying junctions 15 and 16. An indium-mercury solder is formed by dissolving indium in mercury at room temperature until a saturated fluid solution of indium in mercury is produced. Small bits, 11 and 12, of the order of 0.01" x .01" x .01", of the solder are applied to the tops of the respective dots 4 and 5 at room temperature and worked into the surfaces of the dots with a fine wire or the tip of a tweezer until the solder wets the surfaces evenly. The center portion of a copper cooling fin 8 is likewise wetted with the indium-mercury saturated solution, using a small amount of tin chloride flux. The base tab 3 of the transistor is then spot welded to a proper lead 9 and the transistor 1 is placed so that the alloy dot 4 which is to become the collector element is adjacent to and in contact with the mercury solder-wet portion of the copper cooling fin 8. A wire 10, the tip of which has also been wetted with the solder, is then placed so that it rests on the wetted portion of the allow dot 5 which is to become the emitter element. The assembly is coated with coil dope 13 and a layer of paint 14, and potted according to usual techniques in a synthetic resin 17.

In the practice of the invention, according to the application described in the preferred embodiment, it is preferable but not necessary to use a saturated or nearly saturated fluid solution of a metal in mercury. It is also preferable to use a solution in mercury of a metal having at least the same order of solubility in mercury as the metal of which the element, collector and/or emitter, to which the solder is applied, is composed. This is so because the mercury solution is used to wet the surfaces of the collector and emitter elements, and the use of a saturated or nearly saturated solution prevents the mercury from dissolving too much of the elements and thus from penetrating deeply enough to affect the transistor junction. In particular, at room temperature mercury dissolves indium, forming a fluid solution, in all proportions up to about 1.3 parts indium per part mercury by weight. In the preferred embodiment, a mercury solution of indium within the range 1 to 1.3 parts indium per part mercury gives satisfactory results. For reasons of convenience, however, it is preferable to employ a fully saturated solution comprising about 1.3 parts indium per part mercury by weight. However, in other applications where the depth of penetration of the solution is not critical the concentration of the mercury solution may be varied over a wide range which is not critical, and the solution may comprise mercury and any mercury-soluble metal.

For greater convenience, it is also recommended that in the application described in the preferred embodiment the solute in the fluid mercury solution consists of the same metal that composes the surfaces of the collector and emitter elements of the transistor. As explained in the preceding paragraph this is not necessary, but it simplifies the practice of the invention in the particular embodiment described.

In general, a solution comprising any metal in mercury is satisfactory in the practice of the invention in its broader aspects. A large number of different metals are soluble to a greater or lesser extent in mercury. Also, the limits of concentration of the mercury solution are not critical in any way except in certain applications such as, for instance, that described in the preferred embodiment involving an indium element and mercury-indium solder where the depth of penetration of the mercury solution below the wetted surface is critical.

In certain instances where one of the surfaces to be joined is easily wettable by the mercury solution, such as, for instance, a freshly etched silver or copper surface, that surface need not be wetted with the mercury solution prior to being placed in physical contact with the other mercury solution-wetted surface. However, to insure more effective contact between the two surfaces it is preferable to wet both before placing them together. For example, the preferred embodiment includes the use of a tin chloride flux to help the mercury solution to wet the copper cooling fin. Both the wetting of the copper cooling fin surface and the use of a flux to assist the wetting are desirable when using ordinary, contaminated copper, but if the copper has been specially cleaned, and substantially all impurities removed from its surface these two steps may be omitted. In this event the wetted transistor surface may be placed against the dry copper surface.

The action of the mercury solution is not definitely understood. It is believed that in the practice of the invention the mercury solution wets the surfaces to be joined, forming a fluid solution of mercury, the metal originally dissolved therein, and the metals composing the surfaces, thus altering the composition of the surfaces and forming a new alloy. It is believed that through this fluid solution, or alloy, electrical and thermal conduction takes place.

The depth of penetration of the mercury solution below the wetted surface appears to be dependent upon temperature, the degree of solubility in mercury of the metal solute, the degree of solubility in mercury of the metal composing the surface, and the concentration of the mercury solution.

The solubility of most metals in mercury increases as the temperature increases, and so the mercury solution will penetrate more deeply beneath the surface wetted by it as the temperature is increased as, for example, it might be raised during ordinary operation of a device. Therefore, when two surfaces are joined in accordance with the invention at room temperature and the temperature is thereafter increased for any reason, a further penetration of the mercury solution occurs beneath both surfaces. When the temperature is again lowered the mercury solution becomes super-saturated and no longer fluid, but solid. This action of the mercury solution upon an increase and a subsequent decrease in temperature provides a physical bond between the two surfaces joined in accordance with the invention. The physical bond so formed continues as long as the temperature of the surfaces remains below the maximum temperature to which they were raised subsequent to their joining.

There has thus been described an improved method for making electrical and thermal contact between two mercury-soluble metallic surfaces, which improved method is especially useful in mounting semi-conductor devices.

What is claimed is:

1. A semi-conductor device comprising a body of semi-conducting material, a mercury-soluble collector element forming a p-n rectifying junction between said body and said collector element, a mercury-soluble emitter element forming another p-n rectifying junction between said body and said emitter element, and two separate mercury soluble surfaces, said collector element and said emitter element being each held in electrical and thermal contact respectively with said separate mercury-soluble surfaces, said collector element, said emitter element and said surfaces respectively being wetted with a saturated solution comprising mercury and a metal having at least the same order of solubility in mercury as said collector and said emitter elements.

2. A semi-conductor device comprising a germanium body, a collector element comprising indium and forming a p-n rectifying junction with said body, an emitter element comprising indium and forming a second p-n rectifying junction with said body, and two separate mercury-soluble metallic surfaces, said collector element and said emitter element being each respectively in electrical and thermal contact with said separate metallic surfaces, the surfaces of said collector and emitter elements respectively being wet with a saturated solution comprising mercury and indium, and said mercury-soluble metallic surfaces also being wet with said solution.

3. A semi-conductor device comprising a body of semi-conducting material, a mercury-soluble rectifying electrode, and a mercury-soluble surface, said electrode being held in electrical and thermal contact with said surface by a saturated solution comprising mercury and a metal having at least the same order of solubility in mercury as said electrode.

4. A device according to claim 3 in which said electrode is of indium.

References Cited in the file of this patent

UNITED STATES PATENTS

| | | |
|---|---|---|
| 924,827 | Pickard | June 15, 1909 |
| 2,220,961 | Kern | Nov. 12, 1940 |

FOREIGN PATENTS

| | | |
|---|---|---|
| 476,375 | Great Britain | Dec. 7, 1937 |
| 492,088 | Great Britain | Sept. 14, 1938 |